US009476917B2

(12) United States Patent
Tawaragi

(10) Patent No.: US 9,476,917 B2
(45) Date of Patent: *Oct. 25, 2016

(54) POWER THEFT INSPECTION APPARATUS AND POWER THEFT INSPECTION METHOD

(75) Inventor: Yuji Tawaragi, Kanagawa (JP)

(73) Assignee: PIONEER CORPORATION, Kanagawa (JP)

( * ) Notice: Subject to any disclaimer, the term of this patent is extended or adjusted under 35 U.S.C. 154(b) by 87 days.

This patent is subject to a terminal disclaimer.

(21) Appl. No.: 14/383,864

(22) PCT Filed: Mar. 30, 2012

(86) PCT No.: PCT/JP2012/058651
§ 371 (c)(1),
(2), (4) Date: Oct. 1, 2014

(87) PCT Pub. No.: WO2013/145281
PCT Pub. Date: Oct. 3, 2013

(65) Prior Publication Data
US 2015/0035558 A1  Feb. 5, 2015

(51) Int. Cl.
*G01R 31/40* (2014.01)
*G01R 19/00* (2006.01)
(Continued)

(52) U.S. Cl.
CPC ........... *G01R 19/0092* (2013.01); *G01R 21/00* (2013.01); *G01R 31/02* (2013.01); *G01R 31/40* (2013.01); *H02J 5/005* (2013.01); *H02J 7/025* (2013.01)

(58) Field of Classification Search
CPC ....... G01R 11/24; G01R 11/36; G01R 11/04; G01R 11/066; G01R 11/02; G01R 19/0092; G01R 21/00; G01R 31/40; G01R 31/02; G01R 22/22
USPC ............................ 324/110, 127, 157, 764.01
See application file for complete search history.

(56) References Cited

U.S. PATENT DOCUMENTS 7,778,046 B1 *  8/2010  Cuk ...................... H02M 3/157
                                                     323/222
8,339,097 B2 * 12/2012  Kojima ................... H02J 7/025
                                                     320/106
(Continued)

FOREIGN PATENT DOCUMENTS

JP  2008-206231  9/2008
JP  2009-261105  11/2009
(Continued)

OTHER PUBLICATIONS

International Search Report PCT/JP2012/058651 dated Jun. 5, 2012.

*Primary Examiner* — Son Le
*Assistant Examiner* — Thang Le
(74) *Attorney, Agent, or Firm* — Young & Thompson

(57) ABSTRACT

A power theft inspection apparatus (100) is mounted on a power transmitting apparatus (10) which has a power transmission unit (13) and a power supply unit (12) configured to supply alternating current (AC) power to the power transmission unit. The power theft inspection apparatus has a controlling device (101) configured to (i) control the short-circuiting device (SW1, SW2) to electrically cut off the power transmission unit from the power supply unit and to short-circuit the input unit of the power transmission unit, and further (ii) transmit, to the power receiving apparatus (20), a signal indicating a request to open the power reception unit (23), upon power theft inspection, and a determining device (101) configured to determine whether or not there is power theft according to current detected by a current detecting device (102) upon the power theft inspection.

6 Claims, 3 Drawing Sheets

(51) Int. Cl.
  *H02J 5/00*        (2016.01)
  *H02J 7/02*        (2016.01)
  *G01R 21/00*       (2006.01)
  *G01R 31/02*       (2006.01)

(56) References Cited

U.S. PATENT DOCUMENTS

| | | | | |
|---|---|---|---|---|
| 2007/0018617 A1* | 1/2007 | Endo | ............... | H02M 3/158 323/222 |
| 2007/0018618 A1* | 1/2007 | Endo | ............... | H02M 3/1588 323/224 |
| 2008/0129266 A1* | 6/2008 | Endo | ............... | H02M 3/158 323/284 |
| 2008/0200119 A1 | 8/2008 | Onishi et al. | | |
| 2011/0068819 A1* | 3/2011 | Sims | ............... | G01R 31/40 324/764.01 |
| 2011/0121658 A1 | 5/2011 | Fukada | | |
| 2012/0245869 A1* | 9/2012 | Ansari | ............... | G01R 22/066 702/62 |

FOREIGN PATENT DOCUMENTS

| | | |
|---|---|---|
| JP | 4665991 | 1/2011 |
| JP | 2012-065477 | 3/2012 |

* cited by examiner

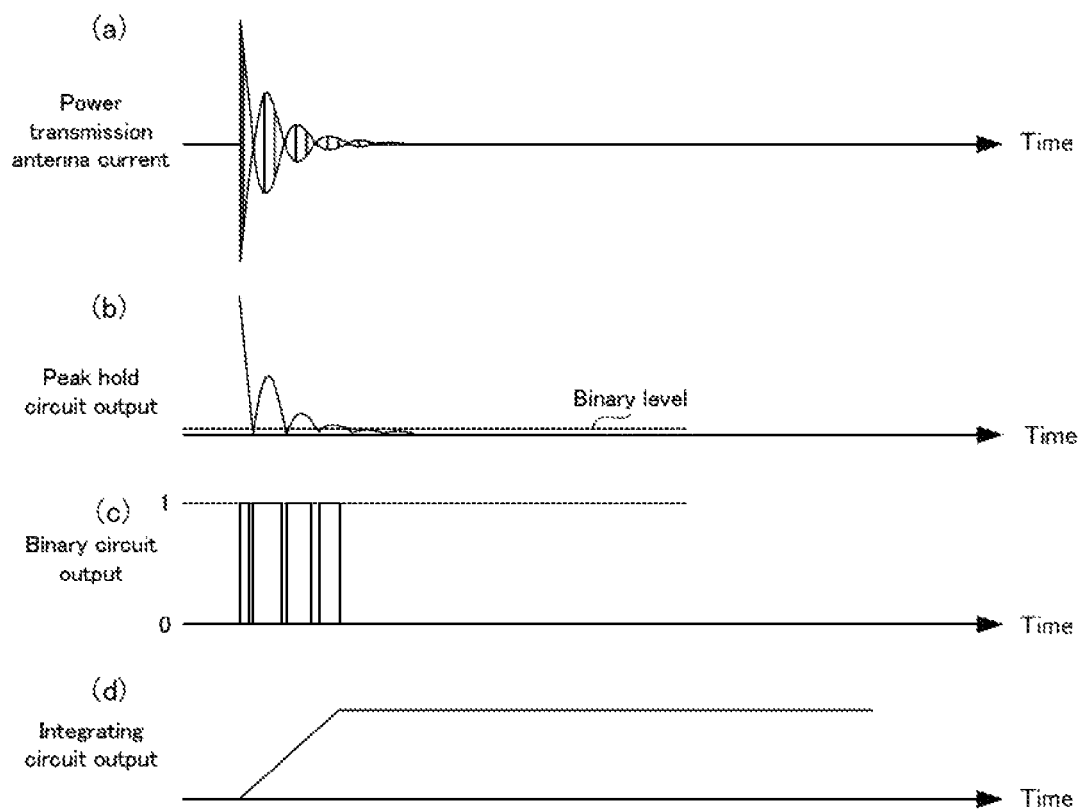

POWER THEFT INSPECTION APPARATUS AND POWER THEFT INSPECTION METHOD

TECHNICAL FIELD

The present invention relates to a power theft inspection apparatus and a power theft inspection method which detect the presence or absence of power theft in a power transmission system in which electric power can be transmitted and received in a wireless manner.

BACKGROUND ART

As this type of apparatus, for example, there is proposed such an apparatus that is provided with a detection unit which is provided with a coil and which detects an oscillating magnetic field formed around a power transmission unit, and that is configured to determine whether or not there is power theft on the basis of the state of the oscillating magnetic field detected by the detection unit (refer to Patent document 1).

PRIOR ART DOCUMENTS

Patent Documents

Patent document 1: Japanese Patent No. 4665991

SUMMARY OF INVENTION

Subject to be Solved by the Invention

In the technology described in the Patent document 1, however, there is a possibility that the oscillating magnetic field changes due to the power theft, but it is also likely hard to set a criterion, which is technically problematic.

In view of the aforementioned problem, it is therefore an object of the present invention to provide a power theft inspection apparatus and a power theft inspection method which can detect the presence or absence of the power theft, relatively easily.

The present invention, however, aims at an apparatus which uses magnetic resonance by a high-Q LCR resonant circuit for power transmission and reception. It is considered that high efficiency is desirably to be obtained upon power theft. Thus, in the present invention, a power the device is assumedly an device, configured to perform the power theft in the magnetic resonance by the high-Q, LCR resonant circuit.

Means for Solving the Subject

The above object of the present invention can be solved by a power theft inspection apparatus mounted on a power transmitting apparatus is provided with: a power transmission unit disposed opposed to a power reception unit of a power receiving apparatus; and a power supply unit configured to supply alternating current (AC) power to the power transmission unit, said power theft inspection apparatus is provided with: a short-circuiting device configured to electrically cut off the power transmission unit from the power supply unit and to short-circuit an input unit of the power transmission unit; a current detecting device configured to detect a current flowing through the power transmission unit; a controlling device configured to (i) control said short-circuiting device to electrically cut off the power transmission unit from the power supply unit and to short-circuit the input unit of the power transmission unit, and further (ii) transmit, to the power receiving apparatus, a signal indicating a request to open the power reception unit, upon power theft inspection; and a determining device configured to determine whether or not there is power theft according to the detected current upon the power theft inspection.

According to the power theft inspection apparatus of the present invention, the power theft inspection apparatus is mounted on the power transmitting apparatus. The power transmitting apparatus is provided with: the power transmission unit disposed opposed to the power reception unit of the power receiving apparatus; and the power supply unit configured to supply the AC power to the power transmission unit. The power transmitting apparatus and the power receiving apparatus exchange electric power in a wireless manner by that the power transmission unit and the power reception unit are coupled with each other by magnetic resonance.

The short-circuiting device is configured to electrically cut off the power transmission unit from the power supply unit and to short-circuit the input unit of the power transmission unit. The "input unit of the power transmission unit" means a part of the power transmission unit to which a wire for electrically connecting the power transmission unit and the power supply unit is electrically and mechanically connected. The "input unit of the power transmission unit" typically has two terminals. The "short-circuit of the input unit" is realized by electrically connecting the two terminals.

The current detecting device which is for example, a current sensor detects the current flowing through the power transmission unit. Here, the power transmission unit has an inductor element and a capacitor element. Thus, if the input unit of the power transmission unit is short-circuited after the AC power is supplied to the power transmission unit, an oscillating current in the power transmission unit gradually decays.

The controlling device which is provided, for example, with a memory, a processor and the like (i) controls the short-circuiting device to electrically cut off the power transmission unit from the power supply unit and to short-circuit the input unit of the power transmission unit, and further (ii) transmits, to the power receiving apparatus, the signal indicating the request to open the power reception unit, upon power theft inspection.

Here, the following matters hold in the power transmission using the magnetic resonance. If the power receiving apparatus opens the power reception unit according to the signal indicating the request to open the power reception unit from the controlling device, this is the same as a case where there is no power reception unit. Thus, if there is no power theft, energy stored in the power transmission unit is consumed only by the power transmission unit. Therefore, the oscillating current in the power transmission unit simply decays, exponentially, according to a Quality factor and resonant frequency of the power transmission antenna. On the other hand, in the case where the power receiving apparatus opens the power reception unit according to the signal indicating the request. to open the power reception unit from the controlling device, if there is the power theft, the energy stored in the power transmission unit is consumed more excessively than an apparatus which performs the power theft. Therefore, the oscillating current in the power transmission unit decays more quickly than in the case where there is no power theft, and an attenuation envelope also changes differently.

Thus, in the present invention, it is determined by the determining device which is provided, for example, with a memory, a processor, a comparator and the like whether or not there is the power theft according to the detected current upon power theft inspection. Since the Quality factor and the resonant frequency of the power transmission unit are determined when designed, there is known a current change detected upon power theft inspection if there is no power theft. By detecting and determining a current change which is different from the above current change, it is possible to relatively easily detect the presence or absence of the power theft. In particular, as opposed to the technology described in the Patent document 1 described above, it is unnecessary to provide a coil for detecting the power theft, separately from the power transmission unit. It is thus possible to prevent, for example, a manufacturing cost increase or the like.

In one aspect of the power theft inspection apparatus of the present invention, said determining device determines whether or not there is the power theft, on the basis of a time constant of attenuation associated with the detected current in a predetermined period after the input unit of the power transmission unit is short-circuited.

The time constant of the current attenuation in the power transmission unit if there is no power theft can be accurately predicted from the Quality factor and the resonant frequency of the power transmission unit determined when designed. Therefore, according to the power theft inspection apparatus of the present invention, the time constant if there is no power theft, which is a reference value, is known. It is thus possible to easily determine whether or not there is the power theft from the fact that the time constant upon power theft inspection is smaller than the reference value.

In another aspect of the power theft inspection apparatus of the present invention, said controlling device controls the power supply unit to reduce the AC power supplied to the power transmission unit before controlling said short-circuiting device to electrically cut off the power transmission unit from the power supply unit and to short-circuit the input unit of the power transmission unit.

According to this aspect, it is possible to prevent a large current from flowing through the power transmission unit if the power transmission unit is short-circuited, which is extremely useful in practice.

The above object of the present invention can be solved by a power theft inspection method in a power theft inspection apparatus mounted on a power transmitting apparatus is provided with: a power transmission unit disposed opposed to a power reception unit of a power receiving apparatus; and a power supply unit configured to supply alternating current (AC) power to the power transmission unit, said power theft inspection apparatus is provided with: a short-circuiting device configured to electrically cut off the power transmission unit from the power supply unit and to short-circuit an input unit of the power transmission unit; and a current detecting device configured to detect a current flowing through the power transmission unit, said power theft inspection method comprising: a controlling process of (i) controlling said short-circuiting device to electrically cut off the power transmission unit from the power supply unit and to short-circuit the input unit of the power transmission unit, and further (ii) transmitting, to the power receiving apparatus, a signal indicating a request to open the power reception unit, upon power theft inspection; and a determining process of determining whether or not there is power theft according to the detected current upon the power theft inspection.

According to the power theft inspection method of the present invention, as in the power theft inspection apparatus of the present invention described above, it is possible to relatively easily detect the presence or absence of the power theft.

Even the power theft inspection method of the present invention can adopt the same various aspects as those of the power theft inspection apparatus of the present invention described above.

The above object of the present invention can be solved by a computer program for making a computer mounted on a power theft inspection apparatus function as a controlling device and a determining device, said power theft inspection apparatus mounted on a power transmitting apparatus is provided with: a power transmission unit disposed opposed to a power reception unit of a power receiving apparatus; and a power supply unit configured to supply alternating current (AC) power to the power transmission unit, said power theft inspection apparatus is provided with: a short-circuiting device configured to electrically cut off the power transmission unit from the power supply unit and to short-circuit an input unit of the power transmission unit; and a current detecting device configured to detect a current flowing through the power transmission unit, said controlling device configured to (i) control said short-circuiting device to electrically cut off the power transmission unit from the power supply unit and to short-circuit the input unit of the power transmission unit, and further (ii) transmit, to the power receiving apparatus, a signal indicating a request to open the power reception unit, upon power theft inspection; and said determining device configured to determine whether or not there is power theft according to the detected current upon the power theft inspection.

According to the computer program of the present invention, the power theft inspection apparatus of the present invention described above can be relatively easily realized as the computer provided for the power theft inspection apparatus reads and executes the computer program from a recording medium for storing the computer program, such as a ROM, a CD-ROM, a DVD-ROM, and a hard disk, or as it executes the computer program after downloading the program through a communication device. This makes it possible to relatively easily detect the presence or absence of the power theft, as in the power theft inspection apparatus of the present invention described above.

The operation and other advantages of the present invention will become more apparent from an embodiment explained below.

BRIEF DESCRIPTION OF DRAWINGS

FIG. 4 are diagrams illustrating one example of a time variation between the current flowing through the power transmission antenna and output of an integration circuit according to the current.

MODES FOR CARRYING OUT THE INVENTION

Hereinafter, an embodiment of the power theft inspection apparatus of the present invention will be explained with reference to the drawings.

Figure 1:
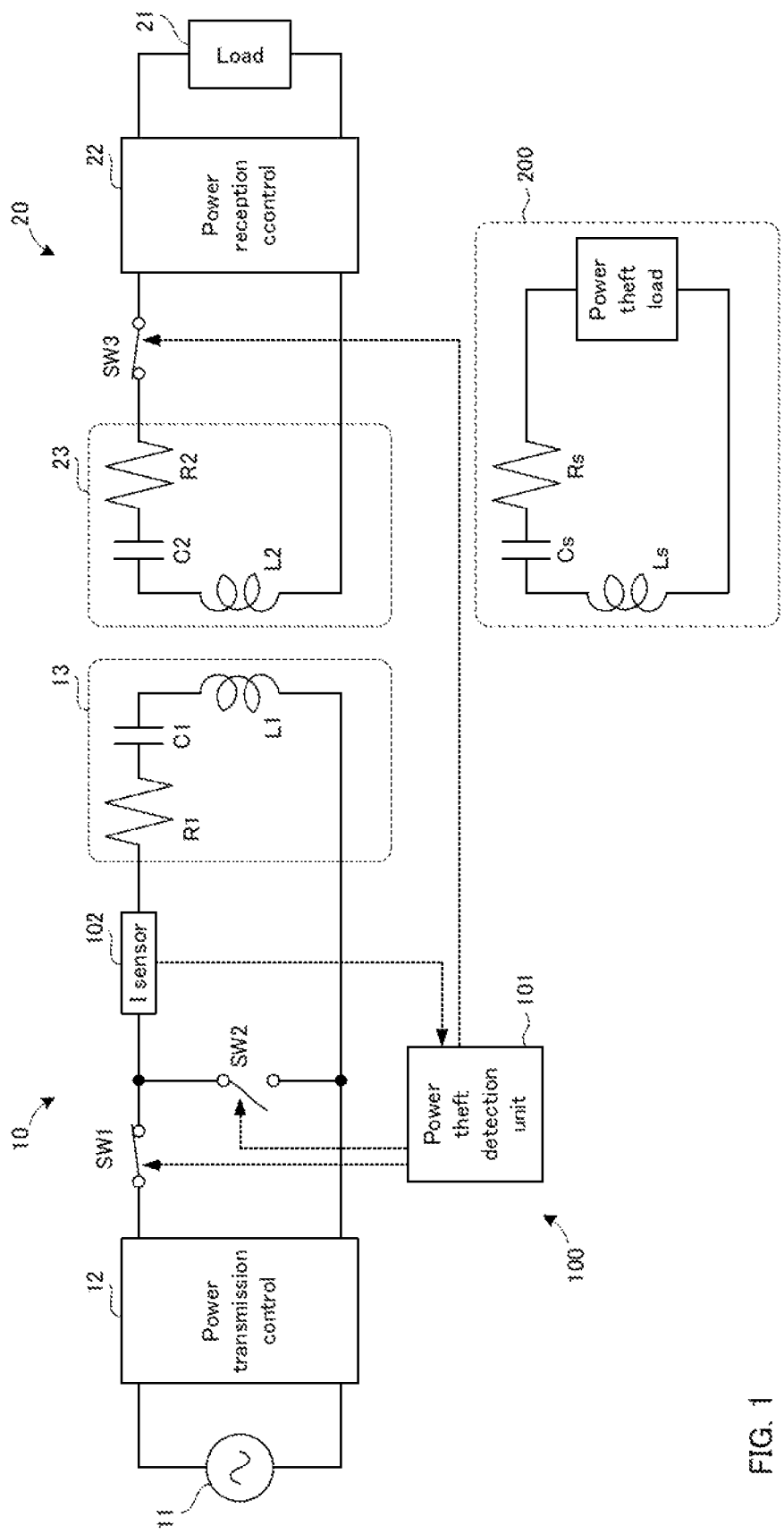
FIG. 1 is a conceptual diagram illustrating a schematic configuration of a wireless power transmission system in an embodiment.

Firstly, a wireless power transmission system in the embodiment will be explained with reference to FIG. 1. FIG. 1 is a conceptual diagram illustrating a schematic configuration of the wireless power transmission system in the embodiment.

In FIG. 1, the wireless power transmission system is provided with a power transmitting apparatus 10 and a power receiving apparatus 20. In the wireless power transmission system, by magnetic resonance, electric power is transmitted and received in a wireless manner between the power transmitting apparatus 10 and the power receiving apparatus 20.

The power transmitting apparatus 10 is provided with an alternating current (AC) power supply 11, a power transmission control unit 12, and a power transmission antenna 13. The power transmission antenna 13 is a series resonant circuit having a coil with inductance L1, a capacitor with capacitance C1, and a resistor with resistance R. The representation of FIG. 1 is equivalent circuit representation, and also includes a case where either C1 or R1 does not exist as an entity (e.g. a case where C1 is parasitic capacitance). Moreover, the representation also includes a case where the frequency characteristics of the power transmission antenna 13 at a frequency used does not strictly match but is approximately equivalent to the equivalent circuit.

The power receiving apparatus 20 is provided with a load 21 such as, for example, a battery, a power reception control unit 22, and a power reception antenna 23. The power reception antenna 23 has the same equivalent circuit representation as that of the power transmission antenna 13 and is a series resonant circuit having a coil with inductance L2, a capacitor with capacitance C2, and a resistor with resistance R2. The power receiving apparatus 20 also includes a case where either C2 or R2 does not exist as an entity. Moreover, the power receiving apparatus 20 also includes a case where the frequency characteristics of the power reception antenna 23 at a frequency used does not strictly match but is approximately equivalent to the equivalent circuit. The power receiving apparatus 20 is provided with a switch SW3 configured to electrically cut off the power reception antenna 23 from the load 21 or the like.

Although the details are omitted, a power theft apparatus 200 has the same configuration as that of the power receiving apparatus 20. The main constituents are a power theft load and a power theft antenna. The power theft antenna is represented by an equivalent circuit having a coil with inductance Ls, a capacitor with capacitance Cs, and a resistor with resistance Rs. Obviously, the power theft apparatus 200 cannot electrically cut off the power theft antenna from the power theft load by a power theft detection unit 101, as opposed to the power receiving apparatus.

In the embodiment, the circuit configuration of each of the power transmission antenna 13 and the power reception antenna 23, and the power theft antenna is equivalent to the high-Q LCR resonant circuit which allows series resonance at a common resonant frequency.

The power theft inspection apparatus 100 is provided with a power theft detection unit 101, a current detector 102, a switch SW1 configured to electrically cut off the power transmission antenna 13 from the AC power supply 11, and a switch SW2 configured to short-circuit an input unit of the power transmission antenna 13. When electric power is supplied from the power transmitting apparatus 10 to the power receiving apparatus 20, the switch SW1 is turned ON, and the switch SW2 is turned OFF.

Upon power theft inspection, the power theft detection unit 101 instructs the following three operations.

(1) The power theft detection unit 101 turns OFF the switch SW1 and turns ON the switch SW2 upon power theft inspection. The power theft detection unit 101 further transmits a signal for requesting to turn OFF the switch SW3, to the power receiving apparatus 20.

Here, in particular, the power theft detection unit 101 controls the AC power supply to reduce AC power supplied to the power transmission antenna 13, before turning OFF the switch SW1. This makes it possible to prevent a large current from flowing through the power transmission antenna 13 after the power transmission antenna 13 is short-circuited.

(2) The power theft detection unit 101 performs the control of the switch SW3 on the power receiving apparatus 20. If the power receiving apparatus 20 turns OFF the switch SW3, the power reception antenna 23 is opened, and a current within the power reception antenna 23 becomes zero. In other words, for the power transmitting apparatus 20, this is the same state as a state in which the power reception antenna 23 is removed. In addition, since the power transmission antenna 13 is short-circuited, a current within the power transmission antenna 13 does not increase but is attenuated by the resistance R1 or the like.

(3) The power theft detection unit 101 determines whether or not there is power theft according to a current detected by the current detector 102 after the power transmission antenna 13 is short-circuited.

Figure 2:
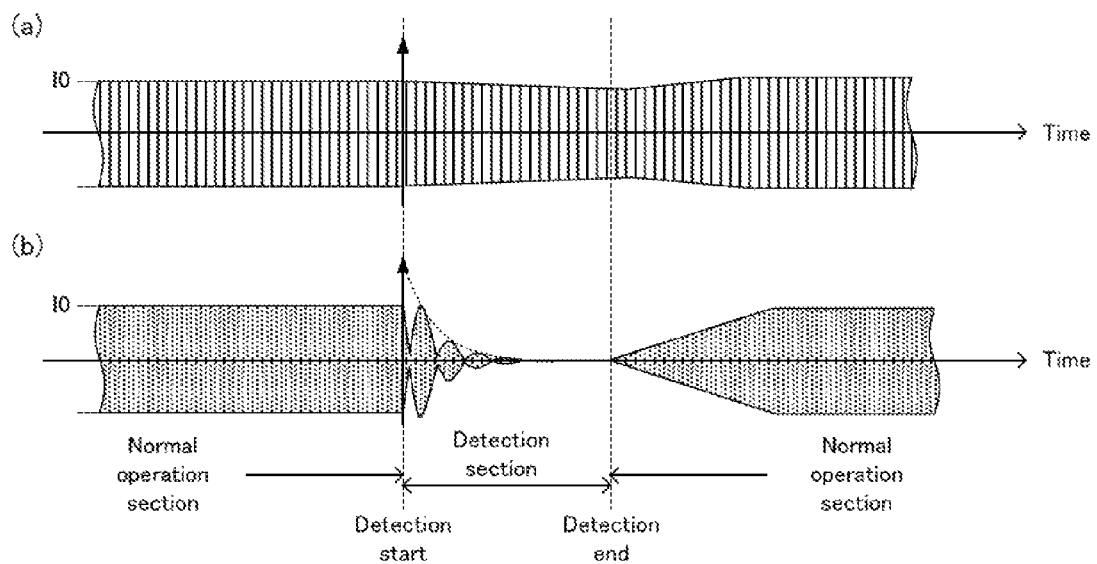
FIG. 2 are diagrams illustrating (a) one example of a time variation of a current flowing through a power transmission antenna if there is no power theft and (b) one example of a time variation of the current flowing through the power transmission antenna if there is power theft.

Next, the power theft determination method will be explained with reference to FIG. 2 to FIG. 4.

Firstly, a change in the current flowing through the power transmission antenna 13 will be theoretically explained. The explanation applies in the case of a power transmission system which uses the magnetic resonance as a premise and in which the resonant frequency of the power transmission/reception antenna and the power theft antenna has a common value ω0.

FIG. 2(a) illustrates one example of a time variation of the current flowing through the power transmission antenna 13 if there is no power theft, and FIG. 2(b) illustrates one example of a time variation of the current flowing through the power transmission antenna if there is the power theft.

Firstly, FIG. 2(a) in which there is no power theft will be explained. As described above, upon power theft inspection, it is considered to be in the same state as a state in which the power reception antenna 23 is removed. Thus, if there is no power theft, energy stored in the power transmission antenna 13 is consumed only by the resistance R1 within the power transmission antenna 13. According to theoretical calculation, a time change I_org(t) of an oscillating current in the power transmission antenna is as follows.

[Equation 1]

$$\text{I\_org}(t) = I0 \cdot \exp\left(-\frac{t}{\tau 0}\right) \cdot \cos(\omega_0 t), \quad (1)$$

$$\tau 0 = \frac{2Q}{\omega_0}$$

wherein, I0 is a peak value of the oscillating current in the power transmission antenna at a start time point of the power theft inspection, ω0 is the resonant frequency of the power transmission antenna, Q is a Quality factor of the power transmission antenna (which is equal to ω0*L1/R1), and τ0 is a time constant determined by the described equation. The initial phase term of the resonant frequency component is not clearly indicated.

In other words, the oscillating current in the power transmission antenna simply decays, exponentially, according to the Quality factor and the resonant frequency of the power transmission antenna. Equation (1) is illustrated in FIG. 2(a).

Next, FIG. 2(b) in which there is the power theft will be explained. If there is the power theft upon power theft inspection, the energy stored in the power transmission antenna 13 is consumed more excessively than the apparatus which performs the power theft. If the power theft antenna has the same resonant frequency ω0 as that of the power transmission antenna, a time change I_steal(t) of an oscillating current in the power transmission antenna is as follows.

[Equation 2]

$$\text{I\_steal}(t) = I1 \cdot \exp\left(-\frac{t}{\tau 1}\right) \cdot \cos(\omega_0 t) \cdot \cos\left(\frac{k\omega_0}{2}t + \phi\right) \quad (2)$$

Wherein, I1 is a peak value of the oscillating current in the power transmission antenna at the start time point of the power theft inspection, ω0 is the resonant frequency of the power transmission antenna and the power theft antenna, k is a coupling coefficient between the power transmission antenna and the power theft antenna, Φ is a initial phase determined in a state at the start time point of the power theft inspection, and τ1 is a time constant determined by the state of the power transmission antenna and the power theft antenna. The initial phase term of the resonant frequency component is not clearly indicated. Equation (2) is illustrated in FIG. 2(b).

If a comparison is made between the time constants τ0 and τ1 of the current attenuation in the Equation (1) and (2) described above, τ0>τ1 holds. In other words, the oscillating current in the power transmission antenna decays earlier than in the case where there is no power theft, and an attenuation envelope also changes differently.

As described above, as is clear from FIG. 2(a) and FIG. 2(b) (or the Equation (1) and (2)), the change in the oscillating current in the power transmission antenna in a power theft inspection section differs depending on the presence or absence of the power theft.

The present inventor has focused on the fact that the presence or absence of the power theft can be easily determined due to the difference in the current attenuation in the power transmission antenna 13, and has incorporated a circuit configured to measure the time constant of the current attenuation (hereinafter referred to as the time constant) τ0 or τ1 into the power theft detection unit 101.

Figure 3:
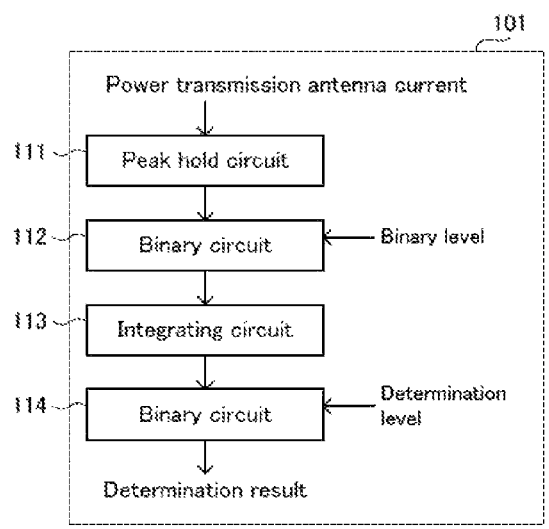
FIG. 3 is a block diagram illustrating a determination circuit within a power theft detection unit in the embodiment.

FIG. 3 is a block diagram illustrating a determination circuit within the power theft detection unit 101 in the embodiment. As a circuit example which can easily measure the time constant, this circuit is configured to have a peak hold circuit 111, a binarization circuit 112, an integrating circuit 113, and a binarization circuit 114.

FIG. 4 illustrate signal waveforms in the respective units of the determination circuit. By using this, the operation of the determination circuit will be explained. Incidentally, this is omitted in FIG. 4, but the integrating circuit 113 of the determination circuit is reset at the start of a detection section. The resetting is performed, for example, by discharging a capacitor if the integrating circuit is configured by using the capacitor.

The peak hold circuit 111 outputs voltage corresponding to the envelope in a case where the current has a positive value as illustrated in FIG. 4(b), from the current detected by the current detector 102 (refer to FIG. 4(a). Then, the binarization circuit 112 binarizes the output of the peak hold circuit 111, according to a predetermined binarization level. The predetermined binarization level is set, for example, at approximately ⅕ to ¹⁄₁₀ of a current value at the start of the detection section.

If there is the power theft, the current in the power transmission antenna 13 relatively rapidly decays, and thus, as illustrated in FIG. 4 (c), the output of the binarization circuit 112 becomes "zero" at a relatively early stage. In other words, the output is "zero" in most of the detection section (refer to FIG. 2). On the other hand, if there is no power theft, the current in the power transmission antenna 13 relatively gradually decays, and thus, the output of the binarization circuit 112 is "1" in most of the detection section (period) (refer to FIG. 2). Since the integrating circuit 113 integrates the output of the binarization circuit 112, there is a large difference in the output of the integrating circuit 113 in the detection section (refer to FIG. 4(d)) between the case where there is the power theft and the case where there is no power theft.

Thus, if the output of the integrating circuit 113 is inputted to the binarization circuit 114 in which an appropriate determination level is set, "1" not outputted from the binarization circuit 114 at an end time point of the detection section in the case where there is the power theft. On the other hand, if there is no power theft, "1" is outputted from the binarization circuit 114 at the end time point of the detection section.

Therefore, the power theft detection unit 101 determines that there is the power theft, in the condition that "1" is not outputted from the binarization circuit 114, at the end time point of the detection section. On the other hand, the power theft detection unit 101 determines that there is no power theft, in the condition that "1" is outputted from the binarization circuit 114, at any time point of the detection section.

As described above, the determination circuit in the embodiment generates the output of the integrating circuit in which the time constant of the current in the detection section is reflected, and it is thus possible to measure the time constant of the current on an extremely simple circuit.

The determination level will be additionally explained. The time constant of the current in the power transmission antenna if there is no power theft can be accurately predicted from the Quality factor and the resonant frequency ω0 of the power transmission unit determined when designed. Therefore, the output value of the integrating circuit 113 if there is no power theft can be easily predicted. By setting the determination level to have a value smaller than this value, it is possible to certainly determine the presence or absence of the power theft.

The determination circuit in the embodiment is one example of what can be easily realized, and can be also realized in another method. For example, the output of the peak hold circuit 111 is AD converted and is calculated by a microprocessor, by which the time constant is obtained by using a program. The power theft determination can be performed from that the time constant is smaller than in the case where there is no power theft. Moreover, the power theft determination can be performed from a difference in the shape of the current change, by performing advanced signal processing.

The detection section is desirably set to be greater than or equal to "2 $Q/\omega_0$" if the resonant frequency of the power transmission antenna 13 is $\omega_0$. Moreover, the power theft inspection is desirably performed, periodically, for example, at intervals of several minutes to several tens of minutes, or the like.

The "power transmission control unit 12", the "power transmission antenna 13", the "power reception antenna 23", and the "current detector 102" in the embodiment are one example of the "power supply unit", the "power transmission unit", the "power reception unit", and the "current detecting device" of the present invention, respectively. The "switch SW1" and the "switch SW2" in the embodiment are one example of the "short-circuiting device" of the present invention. The "power theft detection unit 101" in the embodiment is one example of the "controlling device" and the "determining device" of the present invention.

The present invention is not limited to the aforementioned embodiment, but various changes may be made, if desired, without departing from the essence or spirit of the invention which can be read from the claims and the entire specification. A power theft inspection apparatus and a power theft inspection method which involve such changes are also intended to be within the technical scope of the present invention.

DESCRIPTION OF REFERENCE NUMERALS

10 power transmitting apparatus
11 alternating current power supply
12 power transmission control unit
13 power transmission antenna
20 power receiving apparatus
21 load
22 power reception control unit
23 power reception antenna
100 power theft inspection apparatus
101 power theft detection unit
102 current detector
200 power theft apparatus
SW1, SW2, SW3 switch

The invention claimed is:

1. A power theft inspection apparatus to be mounted on a power transmitting apparatus provided with a power transmission unit and a power supply unit that is configured to supply alternating current (AC) power to the power transmission unit, said power theft inspection apparatus comprising:
a switching device configured to electrically cut off the power transmission unit from the power supply unit and to short-circuit an input unit of the power transmission unit;
a current detecting device configured to detect a current flowing through the power transmission unit; and
a power theft detecting device configured to control said switching device to electrically cut off the power transmission unit from the power supply unit and to short-circuit the input unit of the power transmission unit, and determine whether or not there is power theft according to the detected current by said current detecting device.

2. The power theft inspection apparatus according to claim 1, wherein said power theft detecting device determines whether or not there is the power theft, on the basis of a time constant of attenuation associated with the detected current in a predetermined period after the input unit of the power transmission unit is short-circuited.

3. The power theft inspection apparatus according to claim 1, wherein said power theft detecting device reduces the AC power supplied to the power transmission unit before electrically cutting off the power transmission unit from the power supply unit.

4. The power theft inspection apparatus according to claim 1, wherein said power theft detecting device further transmits, to a power receiving apparatus, a signal indicating a request to open a power reception unit of the power receiving apparatus.

5. A power theft inspection method in a power theft inspection apparatus mounted on a power transmitting apparatus that has a power transmission unit and a power supply unit configured to supply alternating current (AC) power to the power transmission unit, and said power theft inspection apparatus having a switching device configured to electrically cut off the power transmission unit from the power supply unit and to short-circuit an input unit of the power transmission unit and a current detecting device configured to detect a current flowing through the power transmission unit,
said power theft inspection method comprising:
a power theft detecting process of
controlling said switching device to electrically cut off the power transmission unit from the power supply unit and to short-circuit the input unit of the power transmission unit, and
determining whether or not there is power theft according to the detected current by said current detecting device.

6. A non-transitory computer readable medium on which is stored a computer program that, upon execution by a computer mounted on a power theft inspection apparatus, causes the power theft inspection apparatus to function as a power theft detecting device, said power theft inspection apparatus mounted on a power transmitting apparatus that has a power transmission unit and a power supply unit configured to supply alternating current (AC) power to the power transmission unit, said power theft inspection apparatus having a switching device configured to electrically cut off the power transmission unit from the power supply unit and to short-circuit an input unit of the power transmission unit and a current detecting device configured to detect a current flowing through the power transmission unit,
said power theft detecting device configured by way of said computer program operating said computer to
control said switching device to electrically cut off the power transmission unit from the power supply unit and to short-circuit the input unit of the power transmission unit, and
determine whether or not there is power theft according to the detected current by said current detecting device.

* * * * *